United States Patent
Bonomi et al.

(10) Patent No.: US 11,251,786 B1
(45) Date of Patent: Feb. 15, 2022

(54) SUPPLY-TO-DIGITAL REGULATION LOOP

(71) Applicant: Infineon Technologies AG, Neubiberg (DE)

(72) Inventors: Stefano Bonomi, Villach (AT); Frank Praemassing, Ratingen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/313,223

(22) Filed: May 6, 2021

(51) Int. Cl.
*H03M 1/12* (2006.01)
*H03K 5/1252* (2006.01)
*H03M 1/18* (2006.01)
*H03M 1/06* (2006.01)
*H03M 1/10* (2006.01)

(52) U.S. Cl.
CPC ............ *H03K 5/1252* (2013.01); *H03M 1/12* (2013.01); *H03M 1/06* (2013.01); *H03M 1/10* (2013.01); *H03M 1/18* (2013.01)

(58) Field of Classification Search
CPC ............ H03M 1/12; H03M 1/10; H03M 1/06; H03M 1/18
See application file for complete search history.

(56) References Cited

U.S. PATENT DOCUMENTS 5,790,061 A * 8/1998 Norimatsu ............ H03M 1/367
341/120

* cited by examiner

*Primary Examiner* — Joseph J Lauture
(74) *Attorney, Agent, or Firm* — Schiff Hardin LLP

(57) ABSTRACT

A supply-to-digital regulation loop (SDRL) circuit, including a reference supply circuit and a local supply circuit. The reference supply circuit includes a reference supply-to-digital converter (SDC) to convert an analog reference supply voltage to a digital reference signal. The local supply circuit is coupled to the reference supply circuit. The local supply circuit includes a local SDC to convert an analog local supply voltage to a digital local supply signal based on a digital feedback signal, and a local monitoring circuit to monitor the digital feedback signal based on a comparison of the digital local supply signal with the digital reference signal routed from the reference SDC of the reference supply circuit.

25 Claims, 6 Drawing Sheets

SUPPLY-TO-DIGITAL REGULATION LOOP

BACKGROUND

There is a recent trend towards combining separate electrical circuits into a single integrated circuit in order to reduce costs and increase optimization. Such a System-on-Chip (SoC) has circuits in close proximity, which may result in unwanted coupling that degrades system performance. One of the most dangerous couplings is supply interaction. A strategy to reduce supply interaction is to split a common supply domain into local supply domains, each of which is dedicated to one more circuits. However, this involves routing an analog reference voltage at the SoC level to each of the local supply domains via a bus of analog channels, with a risk of coupling between the channels and nearby circuit structures.

DETAILED DESCRIPTION

The present disclosure is directed to a modular supply-to-digital regulation loop configured to monitor, trim, or regulate local supply voltage signals of local supply domains. A reference supply signal has a known voltage, and there may be a plurality of local supply signals that are digitally compared with the reference supply signal and adjusted accordingly. The reference supply signal is a digital signal, which is easier to route to the local supply domains than an analog signal. And the monitoring, trimming, or regulation of each local supply voltage signal is independent and can be performed in parallel.

Outline of Detailed Description and Figures

The supply-to-digital regulation loops (SDRLs) each comprise a supply-to-digital converter (SDC). The SDC constitute parts are described first, followed by the SDRLs. The SDC constitute parts are described in Section I with respect to FIGS. 1 and 1A-C. The SDRLs include a monitoring SDRL (Section II, FIG. 2), a trimming SDRL (Section III, FIG. 3), SDRLs having a calibration phase (Section IV, FIG. 4), and a regulating SDRL (Section V, FIG. 5).

Signals/elements are occasionally illustrated or described with a reference including "x". Unless indicated otherwise, the "x" is intended to be generic, for example, $prg_x$ could represent any of $prg_r$, $prg_1$, $prg_2$ . . . . Also, while the same voltage identifications V1, V2, and V3 may be used in different figures, these voltages and the signals in their domains are not necessarily meant to be the same from figure to figure; the voltages are labeling in accordance with the order in the particular figure.

I. Supply Voltage-to-Digital Converter (SDC)

Figure 1:
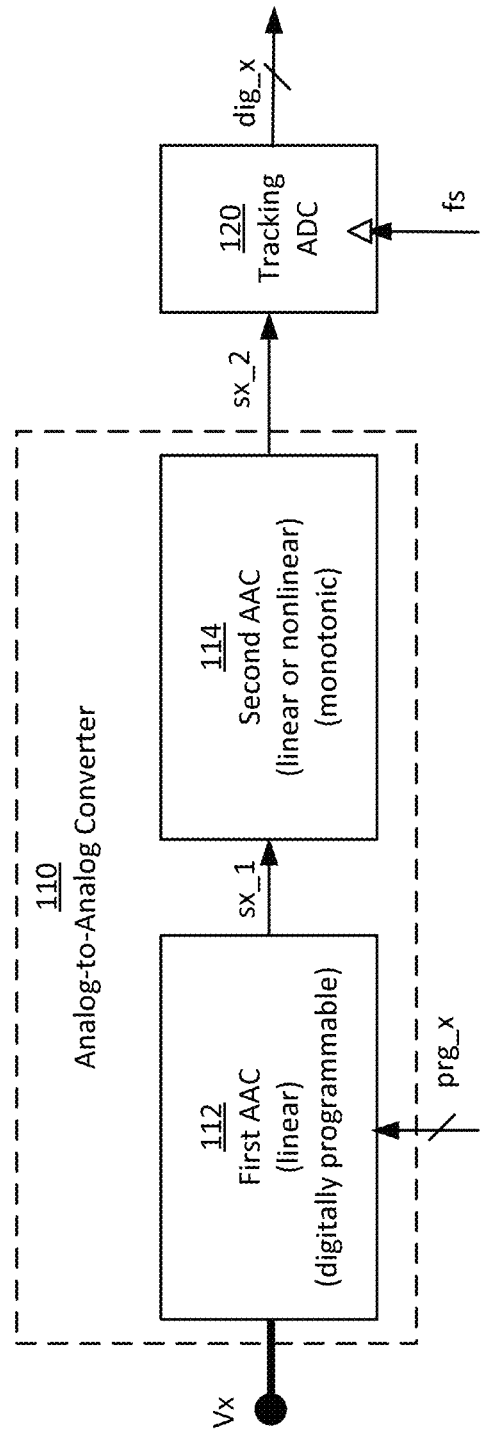
FIG. 1 illustrates a schematic diagram of an open loop supply voltage-to-digital converter (SDC) in accordance with aspects of the disclosure.
Figure 1C:
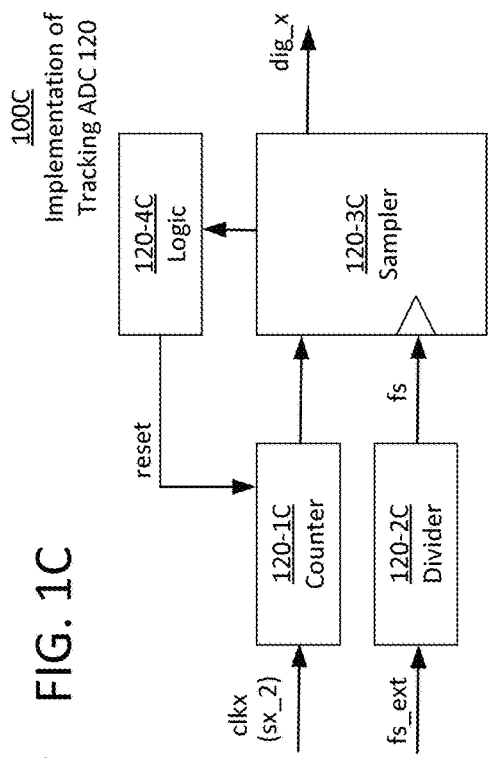
FIG. 1C is a schematic diagram of a possible implementation of the tracking analog-to-digital converter (ADC) of FIG. 1.

FIG. 1 illustrates a schematic diagram of an open loop SDC 100 in accordance with aspects of the disclosure. The SDC 100 is an element of the modular supply-to-digital regulation loop (SDRL), and has two portions—an analog-to-analog converter (AAC) 110 and a tracking analog-to-digital converter (ADC) 120 (FIGS. 1 and 1C). The AAC 110 is comprised of a first AAC 112 (FIGS. 1 and 1A) and a second AAC 114 (FIGS. 1 and 1B).

I.A. First Analog-to-Analog Converter (AAC)

First AAC 112 is configured to convert an analog supply voltage Vx into an analog intermediate signal $sx_1$ (e.g., voltage, current or charge) based on a digital feedback signal $prg_x$.

A requirement on first AAC 112 is having a linear transfer function, that is, the analog intermediate signal $sx_1$ is linearly related to the analog supply voltage Vx and to the digital feedback signal $prg_x$. This linear relationship of first AAC 112 may be expressed as:

$$sx_1 = aVx + b \cdot prg_x Vx, \quad \text{(Equation 1)}$$

with parameters a,b being known parameters. The parameters a,b should be the same for every first AAC 112 of the different SDCs 110, otherwise there should be a calibration phase as described below with respect to FIG. 4. Also, the analog local supply voltage Vx and the digital feedback signal $prg_x$ are independent of PVT (pressure, voltage, temperature).

The first AAC 112 may comprise, for example, a programmable resistive/capacitive divider, a programmable current mirror, and/or an active low pass filter with programmable resistor/capacitor.

Figure 1A:
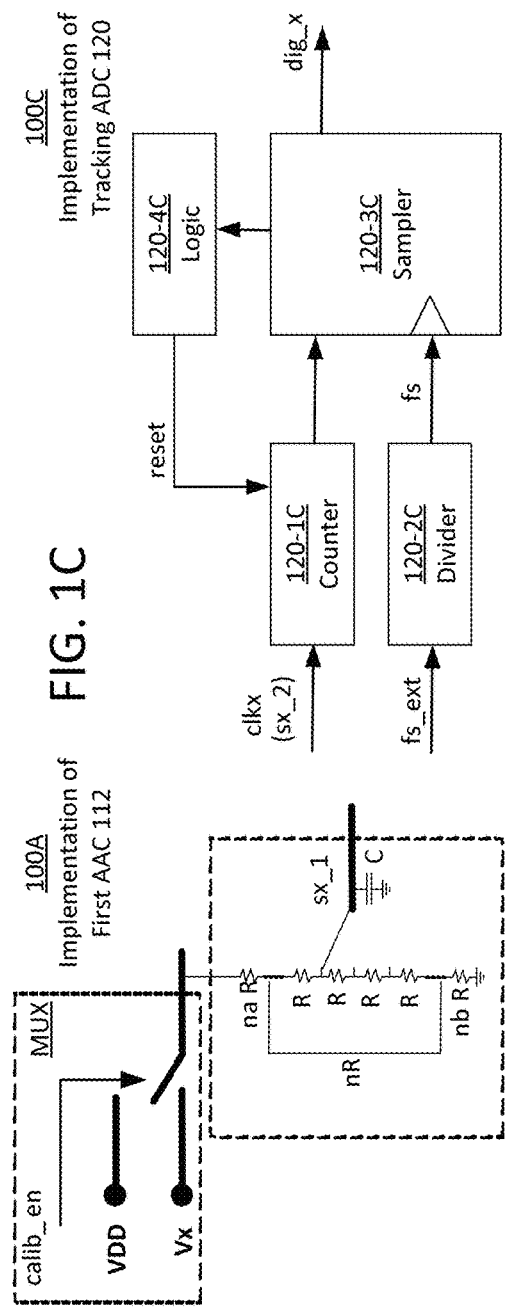
FIG. 1A is a schematic diagram of a possible implementation of a first analog-to-analog converter (AAC) of FIG. 1.
Figure 1B:
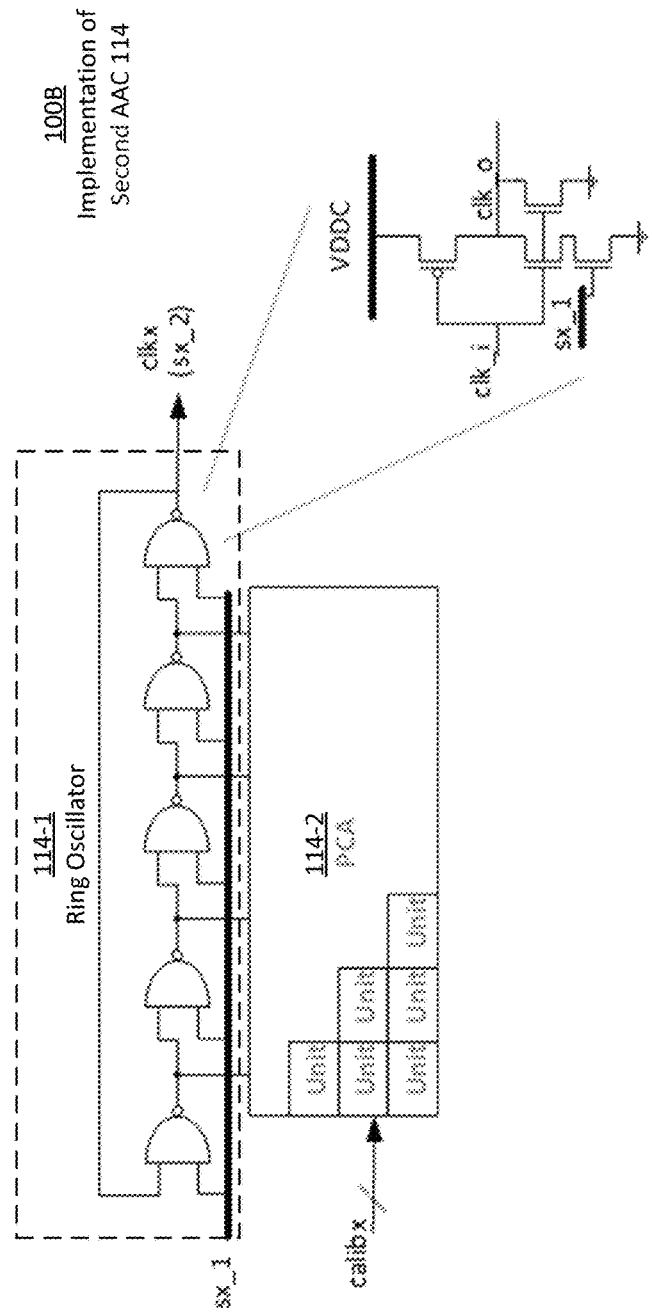
FIG. 1B is a schematic diagram of a possible implementation of a second AAC of FIG. 1.

FIG. 1A is a schematic diagram of a possible implementation 100A of the first AAC 112 of FIG. 1.

The first AAC 112A example implementation is a programmable resistive ladder, with a multiplexer also shown for a calibration phase described below with respect to FIG. 4. The coefficients of first AAC 112 in this implementation may be determined as follows:

$$R_{tot} = naR + nR + nbR = n_{tot}R \quad \text{(Equation 2)}$$

$$sx_1 = \left(\frac{R_{tot} - naR - prg_x R}{R_{tot}}\right)Vx =$$

$$\left(1 - na\left(\frac{R}{R_{tot}}\right)\right)Vx + \left(-prg_x\left(\frac{R}{R_{tot}}\right)\right)Vx \quad \text{(Equation 3)}$$

$$sx_1 = a\ Vx + b \cdot prg_x Vx \quad \text{(Equation 4)}$$

$$\left|\frac{b}{a}\right| = \frac{1}{n + nb} \quad \text{(Equation 5)}$$

The coefficients a,b are used for a ratio of resistances. They do not rely on an absolute value that is difficult to guarantee, but on the matching on the resistor R used $n_{tot}$ times. As consequence, the local variations inside first AAC 112 will affect equally the resistance nominal value R of the same quantity for the $n_{tot}$ resistors, so the coefficients a,b will not be affected. Moreover even first AACs 112 that are physically located far from each other and inevitably have a different nominal resistor values will still have the same coefficients a,b. In addition, the ratio b/a can be set to be <<1, so all requirements on the first AAC 112 may be met.

I.B. Second Analog-to-Analog Converter (AAC)

Second AAC 114 is configured to convert the analog local intermediate signal $sx_1$ into an analog local output signal $sx_2$. The second AAC 114 is designed such that the analog local output signal $sx_2$ depends on the analog local intermediate signal $sx_1$ and a digital calibration signal $calib_x$. The second AAC 114 is monotonic thus simplifying the tracking ADC 120. The second AAC 114 lacks a linearity constraint; the analog local intermediate signal $sx_1$ may be linear or non-linear, or even unknown. The relationship of second AAC 114 may be expressed as:

$$sx_2 = f(sx_1) \quad \text{(Equation 6)}$$

The second AAC 114 may comprise, for example, a voltage controlled oscillator (VCO), be excluded (i.e., first AAC 112 coupled directly to tracking ADC 120), a voltage/current amplifier, and/or a programmable array of tristate inverters.

FIG. 1B is a schematic diagram of a possible implementation 100B of second AAC 114 of FIG. 1.

The example second implementation 100B of second AAC 114 is a ring oscillator 114-1 that is current-starved with a programmable capacitive array (PCA) 114-2. The output of second AAC 114 (i.e., analog output signal $sx_2$) is the frequency of a generated clock signal $clk_x$, while the digital calibration signal $calib_x$ changes the capacitive load of the ring oscillator 114-1 and the analog local intermediate signal $sx_1$ is changing the discharging current. The digital calibration $calib_x$ may be linear or nonlinear, and is monotonic.

I.C. Tracking ADC

The tracking ADC 120 is configured to convert analog output signal $sx_2$ into digital supply signal $dig_x$ at a sample rate fs, and keeps the digital supply signal $dig_x$ constant during a holding period.

The combination of first AAC 112, second AAC 114, and tracking ADC 120 is a supply-to-digital converter (SDC) in which the digital local supply signal $dig_x$ has a monotonic dependency on the analog supply voltage Vx and the digital feedback signal $prg_x$. And the SDC 100 overall lacks a linearity constraint.

The tracking ADC 120 may comprise, for example, a counter and sampler, a flash ADC with comparators, a dual ramp tracking ADC, a delta-sigma modulator first order ADC with analog integrator, and/or a delta modulator with a digital integrator.

FIG. 1C is a schematic diagram of an example implementation 100C of the tracking ADC 120 of FIG. 1.

The tracking ADC 120 of this implementation 100C is designed to retrieve the frequency of the clock signal clkx and may be implemented with a counter 120-1C followed by a sampler 120-3C at the frequency fs. This implementation creates an accumulation and will lead to instability, therefore the counter 120-1C resets every sampling period in response to receiving a reset signal from logic 120-4C.

The sampling frequency fs is a degree of freedom of the system as well as a tradeoff between resolution, time of measure, and power consumption. The sampling frequency $fs_{ext}$ is provided by an external source and can be changed via a divider 120-2C. The different local SDRLs 110 may operate at different sampling frequencies in accordance with system design.

II. Supply-to Digital Regulation Loop (SDRL) for Monitoring

Figure 2:
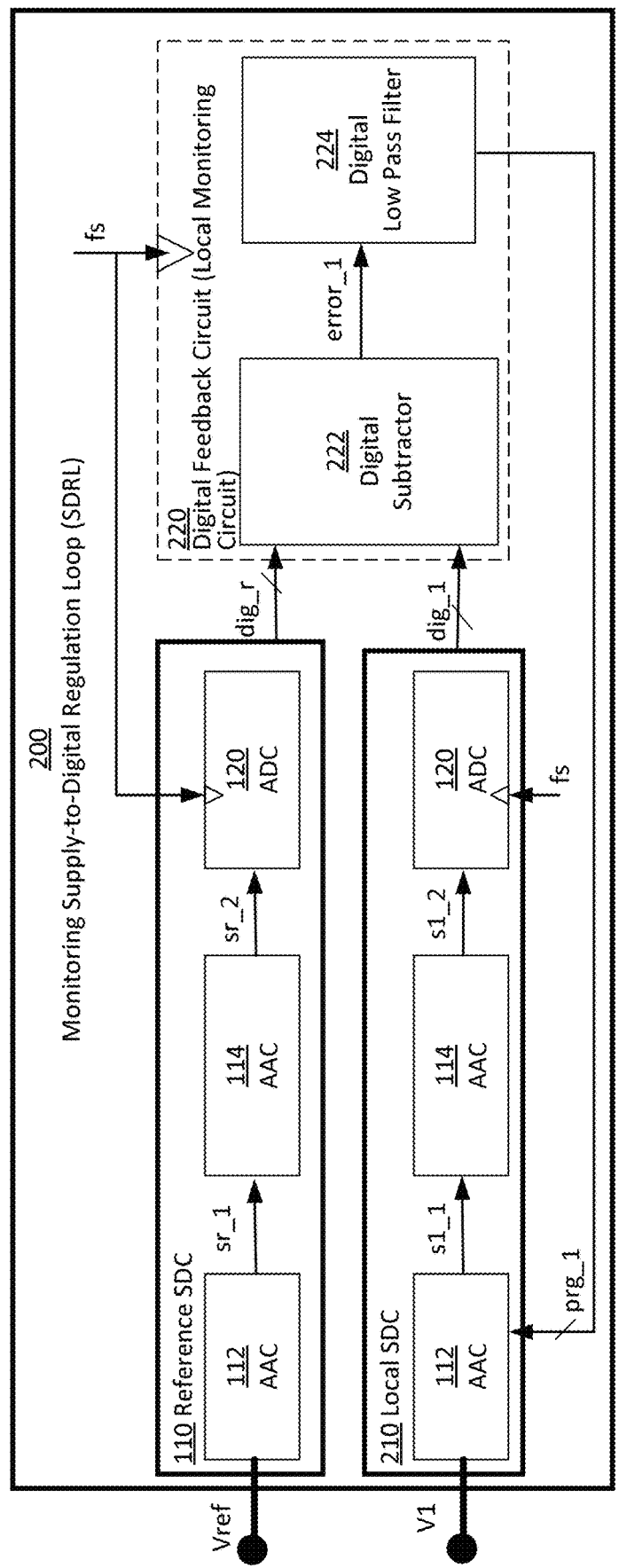
FIG. 2 illustrates a schematic diagram of a supply-to-digital regulation loop (SDRL) for monitoring in accordance with aspects of the disclosure.

FIG. 2 illustrates a schematic diagram of a monitoring SDRL 200 in accordance with aspects of the disclosure.

The SDRL 200 comprises a reference supply circuit, a local supply circuit, and a digital feedback circuit 220, which in this case is referred to as a local monitoring circuit. The reference supply circuit comprises a reference supply-to-digital converter (SDC) 110. The local supply circuit comprises a local SDC 210. The local monitoring circuit 220 forms a negative feedback loop architecture. Each of the reference SDC 110 and the local SDC 210 are based on the modular SDC discussed above with respect to FIG. 1.

II.A. Reference SDC

Reference SDC 110 is configured to convert a known analog reference supply voltage Vref into a digital reference signal $dig_r$. Reference SDC 110 has a fixed programmable digital signal $prg_r$ (not shown).

II.B. Local SDC

Local SDC 210 is configured to convert an analog local supply voltage V1 into a digital local supply signal $dig_1$ based on a digital feedback signal $prg_1$.

II.C. Local Monitoring Circuit

The local monitoring circuit 220 is configured to monitor the digital feedback signal $prg_1$ based on a comparison of the digital local supply signal $dig_1$ with the digital reference signal $dig_r$ routed from the reference SDC 110.

The local monitoring circuit 220 comprises a digital subtractor 222 and a digital low pass filter (LPF) 224. The digital subtractor 222 is configured to output an error signal $error_1$ representing a difference between reference digital reference signal $dig_r$ and digital local supply signal $dig_1$. The digital LPF 224 is configured to filter the error signal $error_1$ and feed it back to the local SDC 210 via digital feedback signal $prg_1$ such that the difference trends toward zero. In principle, the error signal $error_1$ could instead be fed back to the reference SDC 110, but feeding back to the local SDC 210 is more advantageous.

The digital subtractor 222 may comprise, for example, a subtractor, an up/down counter, and/or a frequency detector.

A combination of the reference SDC 110, the local SDC 210, and the local monitoring circuit 220 is a feedback loop configured to regulate the digital local supply feedback signal $prg_1$ until the value of the digital feedback signal $prg_1$ stabilizes when the mean of the error signal $error_1$ is null:

$$\text{mean}(error_1) = 0 \quad \text{(Equation 7)}$$

The feedback process may be expressed as:

$$sr_1 = Vref \cdot (a + b \cdot prg_r) \quad \text{(Equation 8)}$$

$$s1_1 = V1 \cdot (a + b \cdot prg_1) \quad \text{(Equation 9)}$$

$$\text{Feedback loop: } error_1 = \rightarrow sr_1 - s1_1 = 0 \rightarrow s1_1 = sr_1 \rightarrow \quad \text{(Equation 10)}$$

$$V1 \cdot (a + b \cdot prg_1) = Vref \cdot (a + b \cdot prg_r) \quad \text{(Equation 11)}$$

$$V1 = Vref \cdot (1 + b/a \cdot prg_r)/(1 + b/a \cdot prg_1) \sim Vref(1 + b/a \cdot prg_r)(1 - b/a \cdot prg_1) \quad \text{(Equation 12)}$$

which are valid if b/a<<1.

The estimated voltage $V1^{est}$ may be expressed as $$V1^{est} = Vref(1 + b/a \cdot prg_r)(1 - b/a \cdot prg_1), \quad \text{(Equation 13)}$$

where Vref is the known analog reference supply voltage, b/a is a known ratio of the parameters in first AAC 112, programmable digital signal $prg_r$ is a known fixed signal on the reference SDC 110, and $prg_1$ is the programmable digital signal changed by the feedback loop at a sampling frequency fs.

A quantization step can be retrieved noticing that a least significant bit change of programmable digital signal $prg_1$ produces a variation of bV1~bVref. This variation in the programmable digital signal $prg_1$ is enhanced via second AAC 114 and is greater than the resolution of the tracking ADC 120. Therefore b is the quantization error of the analog local supply voltage (monitor voltage) V1 relative to the analog reference supply voltage Vref. These conclusions are valid if the relationship between the first AAC 112 of the reference SDC 110 and the local SDC 210 are the same, and the relationship between the second AAC 114 of the reference SDC 110 and the local SDC 210 are the same.

The local monitoring circuit 220 should be synchronous with the tracking ADC 120. Optional features include flag bits if the digital feedback signal $prg_1$ is out of range, or other digital algorithms to analyze voltage activity.

III. Supply-to Digital Regulation Loop (SDRL) for Trimming

Figure 3:
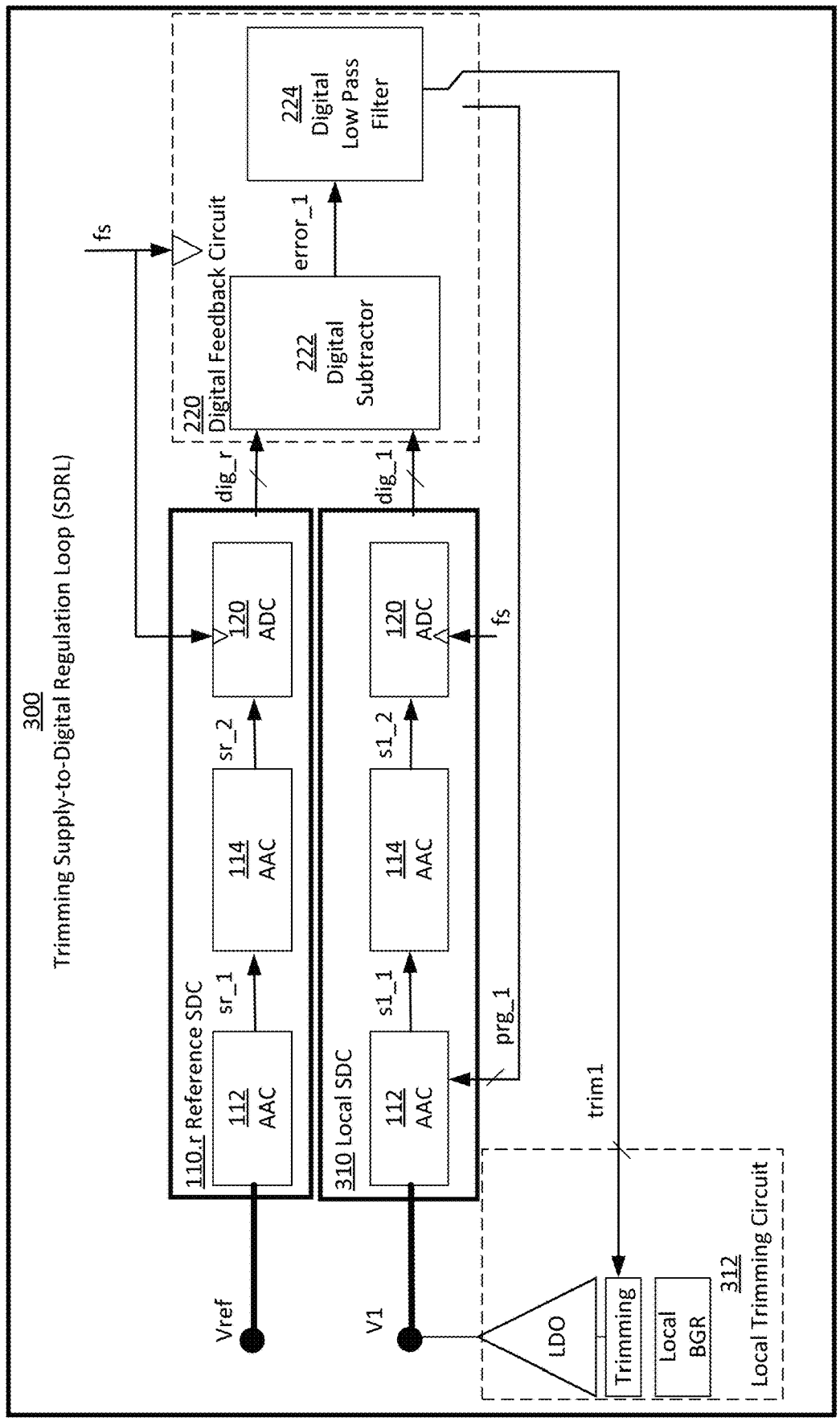
FIG. 3 illustrates a schematic diagram of a trimming SDRL in accordance with aspects of the disclosure.

FIG. 3 illustrates a schematic diagram of a trimming SDRL 300 in accordance with aspects of the disclosure.

The monitoring SDRL 200 discussed above with respect to FIG. 2 closes its regulator loop in first AAC 112 and monitors analog local supply voltage V1. This same concept may be reused in this trimming SDRL 300 to trim the analog local supply voltage V1 by adjusting a local trimming circuit 312 instead of the first AAC 112. This loop is configured to adjust the generated analog local supply voltage V1 to a desired value.

The local trimming circuit 312 comprises a low drop output (LDO) and a local band gap reference (BGR). The local trimming circuit 312 is configured to trim, based on a local bandgap reference voltage and the digital feedback signal (i.e., trimming signal trim1), the analog local supply voltage V1 to have a predetermined value. This predetermined value may equal to the value of the analog reference supply voltage Vref, or alternatively, designed to be different.

Assuming this dependency of the supply voltage V1 on the local trimming circuit 312:

$$V1 = Vbgr(1 + c \cdot trim_1) \quad \text{(Equation 14)}$$

where Vbgr is the band gap reference voltage, c is usually a known value, and $trim_1$ is a trimming digital signal, which is the same signal as the programmable digital signal $prg_r$ that was routed to first AAC 112 in FIG. 2, instead now routed to local trimming circuit 312.

From Equation 14, at stability analog local supply voltage V1 is represented as:

$$V1 = V1^{trim} = Vref(1 + b/a \cdot prg_r)(1 - b/a \cdot prg_1) \quad \text{(Equation 15)}$$

The trimmed analog local supply voltage V1 may be set to a value that is different than the analog reference supply voltage Vref. The programmable digital signal $prg_r$ may be adjusted, but it is more advantageous to adjust the local SDC 310. The feedback loop has a quantization error~c·Vbgr because at stability it is the voltage step moving the analog local supply voltage V1 every sampling frequency fs at stability.

The trimming phase may be performed once. Alternatively, the trimming phase may be performed continuously as a background calibration.

IV. Calibration Phase of Supply Domains in Modular Supply-to-Digital Regulation Loop (MSDRL)

Figure 4:
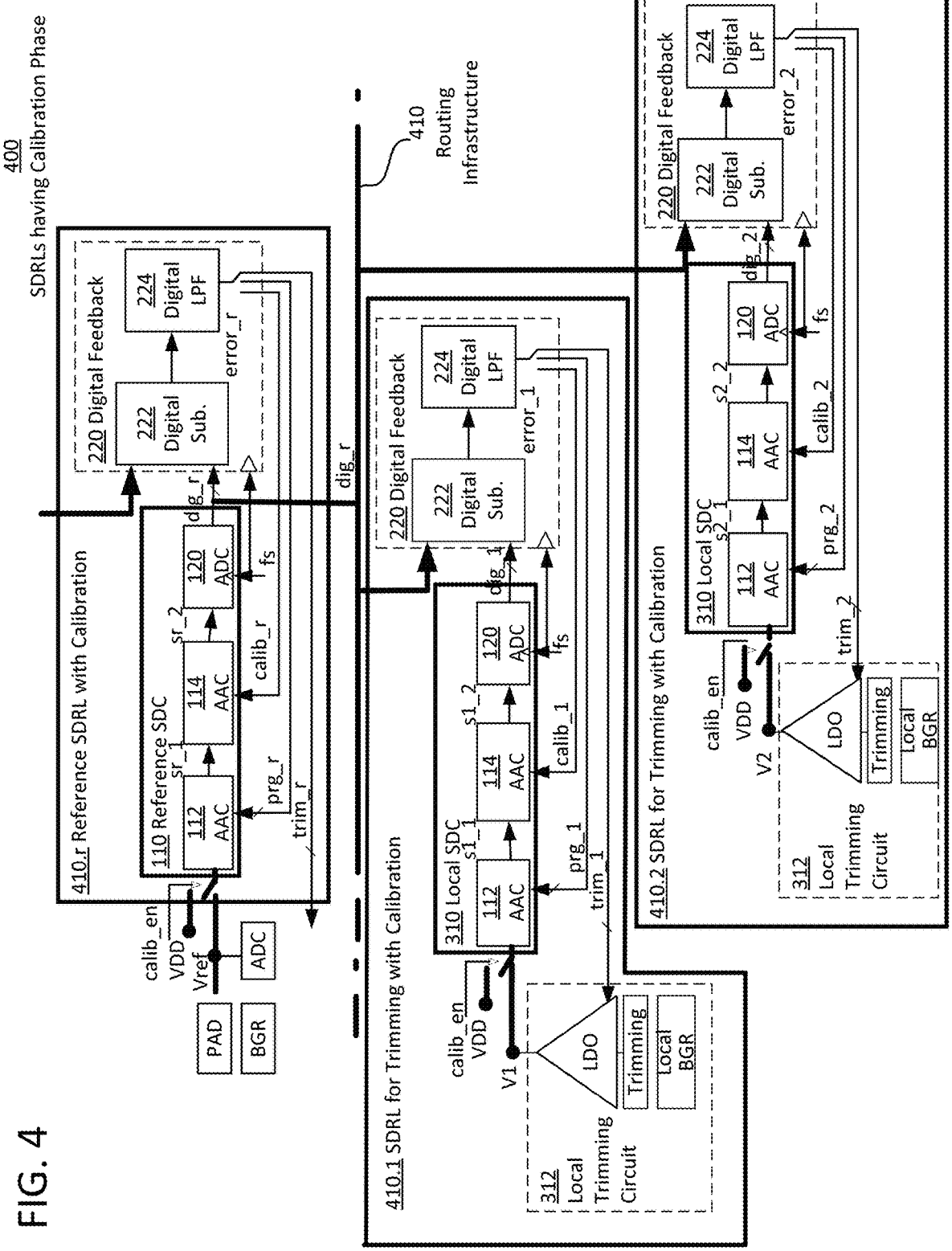
FIG. 4 is a schematic diagram illustrating SDRLs having a calibration phase in accordance with aspects of the disclosure.

FIG. 4 is a schematic diagram 400 illustrating SDRLs for trimming 410.1, 410.2 having a calibration phase in accordance with aspects of the disclosure.

There is a reference supply circuit and a plurality of local supply circuits with respective SDRLs 410.x. The reference supply circuit and each of the plurality of local supply circuits are of modular construction. There is also routing infrastructure 410 to transmit the digital reference signal $dig_r$ from the reference supply circuit to the plurality of local supply circuits. The reference supply circuit and the local supply circuits may be provided on a same chip. Alternatively, the reference supply circuit may be provided on a single chip with the local supply circuits provided one or more other chips.

The local SDRLs with calibration 410.1, 410.2 are for trimming as discussed above with respect to FIG. 3, but the disclosure is not limited in this respect. This figure is used to describe the calibration phase, which is local SDRL-type agnostic. Each of the local SDRLs may be any type, and there may be any number of local SDRLs.

A calibration phase is included because the SDRLs 410.x are located in physically different positions resulting in differences between the analog portions of the SDCs 410.x. These differences can be categorized into constant contributors and time-variant contributors. The constant contributions are, for example, technology-related effects, such as layout mismatches and differences in carrier concentrations. The time-variant contributors depend on the system activities such as temperature gradient and supply of the SDCs gradient. While the constant contributors may be compensated via a one-time calibration, the time-variant contributors are more difficult to address. A strategy is to choose an SDC implementation that is insensitive or has a low dependency on these variations, or alternatively, alternate between calibration and operation.

The first AACs 112 are intrinsically insensitive to the time-variant contributors. The second AACs 114 are nonlinear, and thus there is compensation for the constant contributors. The calibration phase of second AACs 114 may be performed via an additional calibration loop in which a digital calibration signal $calib_x$ of second AACs 114 changes analog local output signal $sx_2$ monotonically.

The reference SDRL 410.r disclosed herein has a known analog reference supply voltage Vref that is converted into a common digital reference signal $dig_r$ that is routed along the system (e.g., SoC) to the local SDRLs 410.1, 410.2. Each local SDRL 410.1, 410.2 may monitor and/or trim its internal supply voltage V1, V2 independently. A calibration phase is set one or more times to compensate for the second AAC 114 differences between the SDRLs 410.x.

The second AAC 114 is chosen to amplify the variations in the analog local output signal $sx_2$ produced by the monitor or trimming loop and by the digital calibration signal $calib_x$ in order to reduce the requirements and complexity on the tracking ADC 120.

To calibrate the SDRLs 410.x, the digital feedback circuits 220 are configured to feed back a digital calibration signal $calib_x$, which is based on the comparison of the digital local supply signal $dig_x$ with the digital reference signal $dig_r$ from the reference SDC 110 of the reference supply circuit, to the second AAC 114 to calibrate the second AAC 114. During this calibration phase of the second AACs 114, the analog local supply voltages Vx of the local supply circuits have a same value, the digital feedback signals $trim_x$ of the local supply circuits have a same value, and each of the digital feedback circuits 220 are further configured to adjust the respective digital calibration signal $calib_x$ to minimize a difference between the respective digital local supply signal $dig_x$ and the digital reference signal $dig_r$, and to minimize a difference between the respective second AAC 114 and each of the other second AACs 114.

The resolution on the tracking ADC 120 should be less than a variation on the analog local output signal $sx_2$ produced by: (1) a change of one least significant bit in the digital local supply signal $dig_x$ and the local trimming signal $trim_x$, during the monitor and trimming phase; and (2) a change of one least significant bit in the digital calibration signal $calib_x$ during the calibration phase.

V. Supply-to Digital Regulation Loop (SDRL) for Regulating

Figure 5:
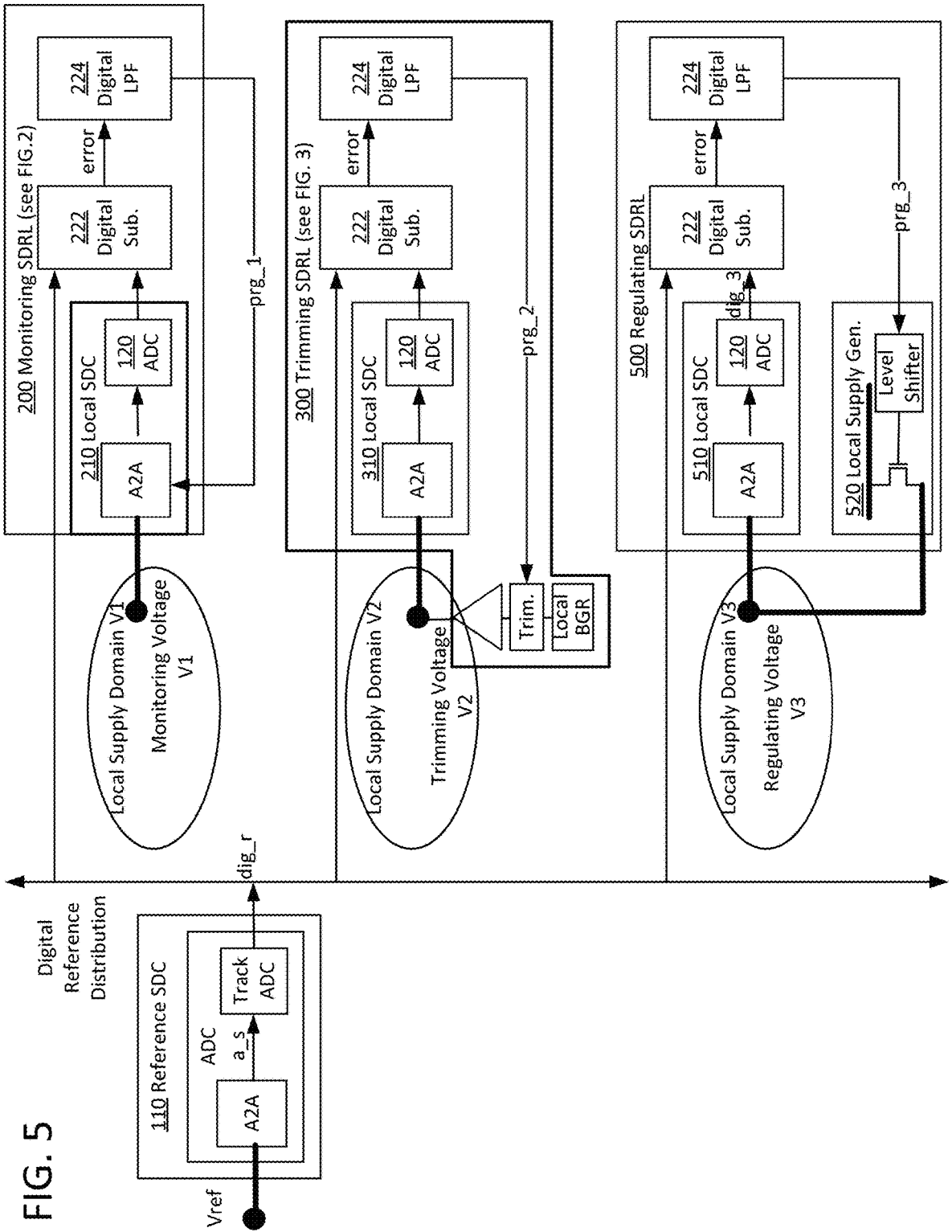
FIG. 5 is a schematic diagram illustrating SDRLs, with a regulating SDRL in accordance with aspects of the disclosure.

FIG. 5 is a schematic diagram illustrating SDRLs, with one regulating SDRL 500 in accordance with aspects of the disclosure.

The SDRLs include monitoring SDRL 200 as discussed above with respect to FIG. 2, the trimming SDRL as discussed above with respect to FIG. 3, and a regulating SDRL 500, which is also coupled to the reference SDC 110 discussed above. The SDRLs 200, 300 are included for illustration purposes only and are not meant to be limiting with respect to regulating SDRL 500. Also, to simplify the figure, the first AAC 112 and the second AAC 114 are combined into a single box A2A.

The monitoring SDRL 200 discussed above with respect to FIG. 2 closes its regulator loop in first AAC 112 and monitors analog local supply voltage V1. This same concept may be reused in this regulating SDRL 500 to generate analog local supply voltage V3 by controlling a local supply generation circuit 510 instead of the first AAC 112. This loop is configured to generate the analog local supply voltage V3 to a desired value.

The local supply circuit for regulating is coupled to the reference supply circuit and comprises a local SDC 510, a local feedback control circuit (comprising digital subtractor 222 and digital LPF 224), and a local supply generation circuit 520. The local SDC 510 is configured to convert an analog local supply voltage V3 to a digital local supply signal $dig_3$. The local feedback control circuit is configured to generate a digital feedback signal $prg_3$ based on a comparison of the digital local supply signal $dig_3$ with the digital reference signal $dig_r$ routed from the reference SDC 110 of the reference supply circuit. The local supply generation circuit 520 is configured to generate the analog local supply voltage V3 based on the digital feedback signal $prg_3$.

The local supply generating circuit 520 may comprise a DAC to convert the digital feedback signal $prg_3$ to the analog local supply voltage V3 having a predetermined voltage value. Instead of trimming an existing LDO, the local supply generation circuit 520 generates a digital LDO. The voltage value V3 may be the same as, or alternatively different from, that of the analog reference supply voltage Vref.

Further, the plurality of local supply circuits may be provided at respective locations in a power grid. The monitoring SDRL 200 may be placed at different point in the power grid to monitor these points for local supply voltage changes, for example, due to a contribution of routing to a pad.

The modular supply-to-digital regulation loops disclosed herein are advantageous over known regulation strategies because it has lower area occupation and power consumption. The structure is modular and can thus be reused to add an additional local supply for monitoring, trimming, or regulation. The routing is only of a low frequency reference digital signal bus along a System-on-Chip. And the monitoring, trimming, or regulation of a local supply signal is independent from others and can be done in parallel.

The techniques of this disclosure may also be described in the following examples.

Example 1. A supply-to-digital regulation loop (SDRL) circuit, comprising: a reference supply circuit, comprising: a reference supply-to-digital converter (SDC) to convert an analog reference supply voltage to a digital reference signal; and a local supply circuit coupled to the reference supply circuit, comprising: a local SDC to convert an analog local supply voltage to a digital local supply signal based on a digital feedback signal; and a local monitoring circuit to monitor the digital feedback signal based on a comparison of the digital local supply signal with the digital reference signal routed from the reference SDC of the reference supply circuit.

Example 2. The SDRL circuit of example 1, wherein the digital local supply signal has a monotonic dependency on the analog local supply voltage and the digital feedback signal.

Example 3. The SDRL circuit of example 1, wherein the local SDC comprises: an analog-to-analog converter (AAC) to convert the analog local supply voltage to an analog local output signal based on the digital feedback signal; and an analog-to-digital converter (ADC) to convert the analog local output signal to the digital local supply signal.

Example 4. The SDRL circuit of example 3, wherein the AAC comprises: a first AAC to convert the analog local supply voltage to an analog local intermediate signal based on the digital feedback signal, wherein the first AAC has a linear transfer function; and a second AAC to convert the analog local intermediate signal to the analog local output signal, wherein the second AAC has a transfer function that is monotonic and lacks a linearity constraint.

Example 5. The SDRL circuit of example 4, wherein the first AAC has a linear transfer function, and the second AAC has a nonlinear transfer function.

Example 6. The SDRL circuit of example 4, wherein the local monitoring circuit is further configured to feed back a digital calibration signal, which is based on the comparison of the digital local supply signal with the digital reference signal from the reference SD of the reference supply circuit, to the second AAC to calibrate the second AAC.

Example 7. The SDRL circuit of example 6, further comprising: a plurality of local supply circuits, wherein during a calibration phase of the second AACs, the analog local supply voltages of the local supply circuits have a same value, the digital feedback signals of the local supply circuits have a same value, and each of the local monitoring circuits is further configured to adjust the respective digital calibration signal to minimize a difference between the respective digital local supply signal and the digital reference signal, and to minimize a difference between the respective second AAC and each of the other second AACs.

Example 8. The SDRL circuit of example 4, wherein a resolution of the ADC is less than a variation on the analog local output signal produced by a change of one least significant bit in the digital local supply signal.

Example 9. The SDRL circuit of example 1, wherein the local monitoring circuit is configured to control the digital feedback signal based on a difference between the digital local supply signal and the digital reference signal until the difference is zero.

Example 10. The SDRL circuit if example 1, wherein the local monitoring circuit comprises: a subtractor to subtract the digital local supply signal from the digital reference signal and output an error signal; and a digital low pass filter to integrate the error signal and output the integrated error signal as the digital feedback signal.

Example 11. The SDRL circuit of example 1, further comprising: a local trimming circuit to trim, based on a local bandgap reference voltage and the digital feedback signal, the analog local supply voltage to have a predetermined value.

Example 12. The SDRL circuit of example 1, further comprising: a plurality of local supply circuits.

Example 13. The SDRL circuit of example 12, wherein the reference supply circuit and each of the plurality of local supply circuits are of modular construction.

Example 14. The SDRL circuit of example 12, further comprising: routing infrastructure to transmit the digital reference signal from the reference supply circuit to the plurality of local supply circuits.

Example 15. A system-on-chip comprising the SDRL circuit of example 1.

Example 16. The SDRL circuit of example 1, wherein the reference supply circuit is provided on a first chip, and the local supply circuit is provided on a second chip.

17. A supply-to-digital regulation loop (SDRL) circuit, comprising: a reference supply circuit, comprising: a reference supply-to-digital converter (SDC) to convert an analog reference supply voltage to a digital reference signal; and a local supply circuit coupled to the reference supply circuit, comprising: a local SDC to convert an analog local supply voltage to a digital local supply signal; a local feedback control circuit to generate a digital feedback signal based on a comparison of the digital local supply signal with the digital reference signal routed from the reference SDC of the reference supply circuit; and a local supply providing circuit configured to provide the analog local supply voltage based on the digital feedback signal.

18. The SDRL circuit of example 17, wherein the local supply providing circuit comprises: a local voltage trimming circuit to trim, based on the digital feedback signal and a local bandgap reference voltage, the analog local supply voltage to a predetermined voltage value.

19. The SDRL circuit of example 17, wherein the local supply providing circuit comprises: a local supply generating circuit to generate, based on the digital feedback signal, the analog local supply voltage having a predetermined voltage value.

Example 20. The SDRL circuit of example 19, wherein the local supply generating circuit comprises a digital-to-analog converter (DAC) to convert the digital feedback signal to the analog local supply voltage having the predetermined voltage value.

Example 21. The SDRL circuit of example 19, wherein the predetermined voltage value of the analog local supply voltage is different from that of the analog reference supply voltage.

Example 22. The SDRL circuit of example 17, wherein the digital local supply signal has a monotonic dependency on the analog local supply voltage and the digital feedback signal.

Example 23. The SDRL circuit of example 17, wherein the local SDC lacks a linearity constraint.

Example 24. The SDRL circuit of example 17, further comprising: a power grid; and a plurality of local supply circuits provided at respective locations in the power grid and having respective analog local supply voltage values.

Example 25. A supply-to-digital regulation loop (SDRL) method, comprising: converting, by a reference analog-to-digital converter (ADC) of a reference supply circuit, an analog reference supply voltage to a digital reference signal; converting, by a local ADC of a local supply circuit coupled to the reference supply circuit, an analog local supply voltage to a digital local supply signal based on a digital feedback signal; and monitoring, by a local monitoring circuit of the local supply circuit, the digital feedback signal based on a comparison of the digital local supply signal with the digital reference signal routed from the reference ADC of the reference supply circuit.

Example 26. The SDRL method of example 25, wherein the converting the analog local supply voltage to the digital local supply signal SDC comprises: converting, by an analog-to-analog converter (AAC), the analog local supply voltage to an analog local output signal based on the digital feedback signal; and converting, by an analog-to-digital converter (ADC), the analog local output signal to the digital local supply signal.

Example 27. The SDRL method of example 26, wherein the converting by the AAC comprises: converting, by a first AAC, the analog local supply voltage to an analog local intermediate signal based on the digital feedback signal, wherein the first AAC has a linear transfer function; and converting, by a second AAC, the analog local intermediate signal to the analog local output signal, wherein the second AAC has a transfer function that is monotonic and lacks a linearity constraint.

Example 28. The SDRL method of example 28, wherein the monitoring by the local monitoring circuit further comprises feeding back a digital calibration signal, which is based on the comparison of the digital local supply signal with the digital reference signal from the reference SD of the reference supply circuit, to the second AAC to calibrate the second AAC.

Example 29. The SDRL method of example 25, further comprising: trimming, by a local trimming circuit, based on a local bandgap reference voltage and the digital feedback signal, the analog local supply voltage to have a predetermined value.

Example 30. A supply-to-digital regulation loop (SDRL) method, comprising: converting, by a reference supply-to-digital converter (SDC) of a reference supply circuit, an analog reference supply voltage to a digital reference signal; converting, by a local SDC of a local supply circuit coupled to the reference supply circuit, an analog local supply voltage to a digital local supply signal; generating, by a local feedback control circuit of the local supply circuit, a digital feedback signal based on a comparison of the digital local supply signal with the digital reference signal routed from the reference SDC of the reference supply circuit; and providing, by a local supply providing circuit of the local supply circuit, the analog local supply voltage based on the digital feedback signal.

Example 31. The SDRL method of example 30, wherein the providing comprises: trimming, by a local voltage trimming circuit, based on the digital feedback signal and a local bandgap reference voltage, the analog local supply voltage to a predetermined voltage value.

Example 32. The SDRL method of example 30, wherein the providing comprises: generating, by a local supply generating circuit, based on the digital feedback signal, the analog local supply voltage having a predetermined voltage value.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A supply-to-digital regulation loop (SDRL) circuit, comprising:
   a reference supply circuit, comprising:
      a reference supply-to-digital converter (SDC) to convert an analog reference supply voltage to a digital reference signal; and
   a local supply circuit coupled to the reference supply circuit, comprising:
      a local SDC to convert an analog local supply voltage to a digital local supply signal based on a digital feedback signal; and
      a local monitoring circuit to monitor the digital feedback signal based on a comparison of the digital local supply signal with the digital reference signal routed from the reference SDC of the reference supply circuit.

2. The SDRL circuit of claim 1, wherein the digital local supply signal has a monotonic dependency on the analog local supply voltage and the digital feedback signal.

3. The SDRL circuit of claim 1, wherein the local SDC comprises:
   an analog-to-analog converter (AAC) to convert the analog local supply voltage to an analog local output signal based on the digital feedback signal; and
   an analog-to-digital converter (ADC) to convert the analog local output signal to the digital local supply signal.

4. The SDRL circuit of claim 3, wherein the AAC comprises:
   a first AAC to convert the analog local supply voltage to an analog local intermediate signal based on the digital feedback signal, wherein the first AAC has a linear transfer function; and
   a second AAC to convert the analog local intermediate signal to the analog local output signal, wherein the second AAC has a transfer function that is monotonic and lacks a linearity constraint.

5. The SDRL circuit of claim 4, wherein the first AAC has a linear transfer function, and the second AAC has a nonlinear transfer function.

6. The SDRL circuit of claim 4, wherein the local monitoring circuit is further configured to feed back a digital calibration signal, which is based on the comparison of the digital local supply signal with the digital reference signal from the reference SD of the reference supply circuit, to the second AAC to calibrate the second AAC.

7. The SDRL circuit of claim 6, further comprising:
   a plurality of local supply circuits,
      wherein during a calibration phase of the second AACs, the analog local supply voltages of the local supply circuits have a same value, the digital feedback signals of the local supply circuits have a same value, and each of the local monitoring circuits is further configured to adjust the respective digital calibration signal to minimize a difference between the respective digital local supply signal and the digital reference signal, and to minimize a difference between the respective second AAC and each of the other second AACs.

8. The SDRL circuit of claim 4, wherein a resolution of the ADC is less than a variation on the analog local output signal produced by a change of one least significant bit in the digital local supply signal.

9. The SDRL circuit of claim 1, wherein the local monitoring circuit is configured to control the digital feedback signal based on a difference between the digital local supply signal and the digital reference signal until the difference is zero.

10. The SDRL circuit if claim 1, wherein the local monitoring circuit comprises:
    a subtractor to subtract the digital local supply signal from the digital reference signal and output an error signal; and
    a digital low pass filter to integrate the error signal and output the integrated error signal as the digital feedback signal.

11. The SDRL circuit of claim 1, further comprising:
    a local trimming circuit to trim, based on a local bandgap reference voltage and the digital feedback signal, the analog local supply voltage to have a predetermined value.

12. The SDRL circuit of claim 1, further comprising:
    a plurality of local supply circuits.

13. The SDRL circuit of claim 12, wherein the reference supply circuit and each of the plurality of local supply circuits are of modular construction.

14. The SDRL circuit of claim 12, further comprising:
    routing infrastructure to transmit the digital reference signal from the reference supply circuit to the plurality of local supply circuits.

15. A system-on-chip comprising the SDRL circuit of claim 1.

16. The SDRL circuit of claim 1, wherein the reference supply circuit is provided on a first chip, and the local supply circuit is provided on a second chip.

17. A supply-to-digital regulation loop (SDRL) circuit, comprising:
    a reference supply circuit, comprising:
       a reference supply-to-digital converter (SDC) to convert an analog reference supply voltage to a digital reference signal; and
    a local supply circuit coupled to the reference supply circuit, comprising:
       a local SDC to convert an analog local supply voltage to a digital local supply signal;
       a local feedback control circuit to generate a digital feedback signal based on a comparison of the digital local supply signal with the digital reference signal routed from the reference SDC of the reference supply circuit; and
       a local supply providing circuit configured to provide the analog local supply voltage based on the digital feedback signal.

18. The SDRL circuit of claim 17, wherein the local supply providing circuit comprises:
    a local voltage trimming circuit to trim, based on the digital feedback signal and a local bandgap reference voltage, the analog local supply voltage to a predetermined voltage value.

19. The SDRL circuit of claim 17, wherein the local supply providing circuit comprises:
    a local supply generating circuit to generate, based on the digital feedback signal, the analog local supply voltage having a predetermined voltage value.

20. The SDRL circuit of claim 19, wherein the local supply generating circuit comprises a digital-to-analog converter (DAC) to convert the digital feedback signal to the analog local supply voltage having the predetermined voltage value.

21. The SDRL circuit of claim 19, wherein the predetermined voltage value of the analog local supply voltage is different from that of the analog reference supply voltage.

22. The SDRL circuit of claim 17, wherein the digital local supply signal has a monotonic dependency on the analog local supply voltage and the digital feedback signal.

23. The SDRL circuit of claim 17, wherein the local SDC lacks a linearity constraint.

24. The SDRL circuit of claim 17, further comprising:
   a power grid; and
   a plurality of local supply circuits provided at respective locations in the power grid and having respective analog local supply voltage values.

25. A supply-to-digital regulation loop (SDRL) method, comprising:
   converting, by a reference analog-to-digital converter (ADC) of a reference supply circuit, an analog reference supply voltage to a digital reference signal;
   converting, by a local ADC of a local supply circuit coupled to the reference supply circuit, an analog local supply voltage to a digital local supply signal based on a digital feedback signal; and
   monitoring, by a local monitoring circuit of the local supply circuit, the digital feedback signal based on a comparison of the digital local supply signal with the digital reference signal routed from the reference ADC of the reference supply circuit.

* * * * *